United States Patent
Tsang

(10) Patent No.: US 8,476,653 B2
(45) Date of Patent: Jul. 2, 2013

(54) LIGHT-EMITTING DIODE PACKAGE

(75) Inventor: Jian-Shihn Tsang, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 140 days.

(21) Appl. No.: 13/030,152

(22) Filed: Feb. 18, 2011

(65) Prior Publication Data

US 2012/0138978 A1 Jun. 7, 2012

(30) Foreign Application Priority Data

Dec. 1, 2010 (TW) .................................. 99141611

(51) Int. Cl.
*H01L 33/48* (2010.01)
(52) U.S. Cl.
USPC ..................... 257/89; 257/E33.056
(58) Field of Classification Search
USPC ....................... 257/89, E33.056, 79
See application file for complete search history.

(56) References Cited

U.S. PATENT DOCUMENTS

2007/0223219 A1* 9/2007 Medendorp et al. .......... 362/231

* cited by examiner

*Primary Examiner* — Victor A Mandala
*Assistant Examiner* — Whitney T Moore
(74) *Attorney, Agent, or Firm* — Altis Law Group, Inc.

(57) ABSTRACT

A light-emitting diode (LED) package includes a first chip group, a second chip group and an optical wavelength converting substance. The first chip group includes a plurality of red LED chips configured for emitting red light. The second chip group includes a plurality of blue LED chips configured for emitting blue light. The optical wavelength converting substance is arranged on light paths of the blue LED chips. The optical wavelength converting substance is configured for partly absorbing blue light emitted from the blue LED chips and emitting visible lights with different wavelengths. The plurality of blue LED chips has a total light output larger than that of the plurality of red LED chips.

12 Claims, 4 Drawing Sheets

LIGHT-EMITTING DIODE PACKAGE

BACKGROUND

1. Technical Field

The present disclosure generally relates to light-emitting diode (LED) packages, and particularly to a white LED package.

2. Description of Related Art

Recently, various attempts have been made to make white light sources by using light-emitting diodes (LEDs). A general kind of white LED includes an LED chip capable of emitting a blue color light, and a phosphor capable of absorbing a part of the blue color light and emitting a yellow color light. As such, the blue color light and the yellow color light from the phosphor can be mixed to make a white color. However, this kind of white LED has poor color rendition.

In order to make excellent color rendition, another kind of white LED constructed of three types of LED chips of red (R), green (G) and blue (B) is provided. As such, rays of light emitted by the three types of LED chips are diffused and mixed to make a white color. However, due to the variety of LED chips with different colors, a process of packaging this kind of white LED is undesirably complicated.

Therefore, what is needed is to provide an LED package to overcome above mentioned shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED package in detail.

Figure 1:
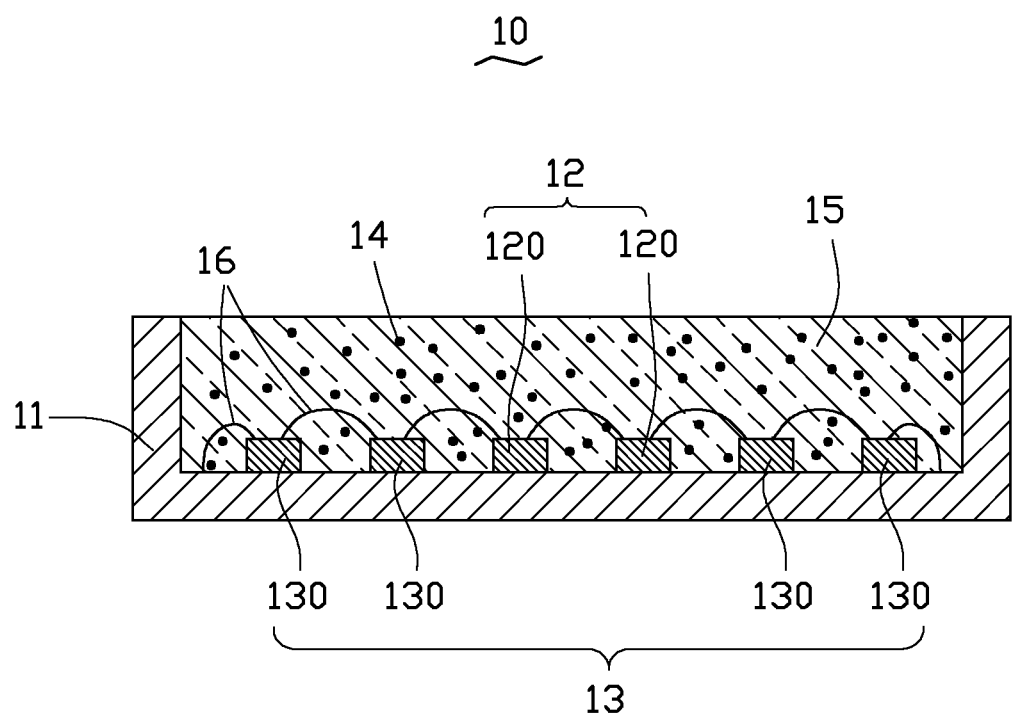
FIG. 1 is a cross-sectional view of an LED package in accordance with an embodiment of the present disclosure.

Referring to FIG. 1, an LED package 10 according to an exemplary embodiment includes a substrate 11, a first chip group 12, a second chip group 13, an optical wavelength converting substance 14, and an encapsulation 15.

The substrate 11 is configured for supporting the first chip group 12, the second chip group 13, the optical wavelength converting substance 14 and the encapsulation 15. The substrate 11 has a circuit trace (not illustrated) formed thereon/therein. The substrate 11 can be made of electrically insulating materials such as plastic, ceramic and so on. In this embodiment, the substrate 11 is made of ceramic.

Figure 3:
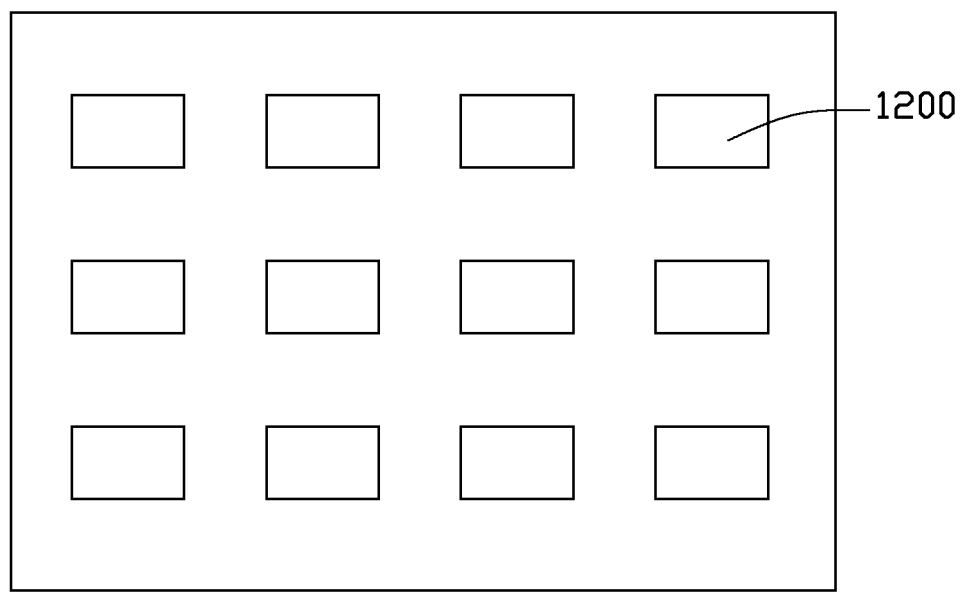
FIG. 3 is an enlarged top view of an LED red chip of FIG. 1.

The first chip group 12 includes a plurality of red LED chips 120 for emitting red light. The plurality of red LED chips 120 is arranged on the substrate 11 and electrically connected to the circuit trace of the substrate 11 by wire boding or flip-chip process. Therefore, the circuit trace provides electrical power to the red LED chips 120. Referring to FIG. 3, in this embodiment, the red LED chips 120 each include a plurality of red LED dies 1200. The plurality of red LED dies 1200 can be electrically connected together in series, in parallel or in hybrid. In this embodiment, the plurality of red LED dies 1200 is connected together in series.

Figure 4:
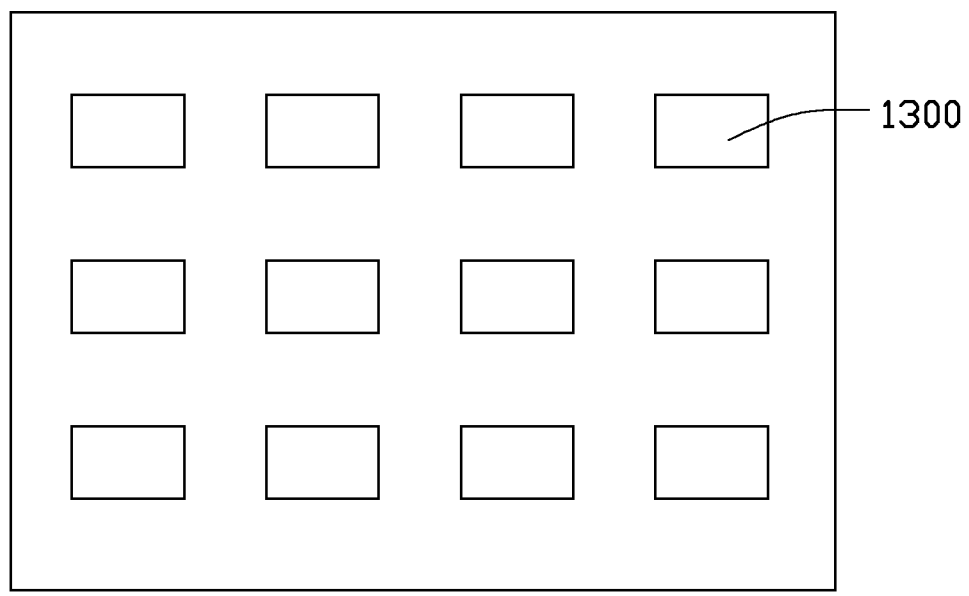
FIG. 4 is an enlarged top view of a blue LED chip of FIG. 1.

The second chip group 13 includes a plurality of blue LED chips 130 for emitting blue light. The plurality of blue LED chips 130 is arranged on the substrate 11 and electrically connected to the circuit trace of the substrate 11 by wire boding or flip-chip process. Therefore, the circuit trace provides electrical power to the blue LED chips 130. Referring to FIG. 4, in this embodiment, the blue LED chips 130 each include a plurality of blue LED dies 1300. The plurality of blue LED dies can be electrically connected together in series, in parallel or in hybrid. In this embodiment, the plurality of blue LED dies 1300 is connected together in series.

The optical wavelength converting substance 14 is arranged on light paths of the second chip group 13 and includes a fluorescent material capable of absorbing a part of blue light emitted from the second chip group 13 and converting the absorbed blue light into a green color light. As such, the red light from the first chip group 12, the remained blue light of the second chip group 13 and the green light from the optical wavelength converting substance 14 can be mixed to produce a white color.

The encapsulation 15 is made of light pervious material. The encapsulation 15 covers the first chip group 12 and the second chip group 13, thereby isolating the first chip group 12 and the second chip group 13 from exterior environment. The encapsulation 15 has the optical wavelength converting substance 14 mixed therein, thereby keeping the optical wavelength converting substance 14 on light paths of the second chip group 13.

In this embodiment, the red LED chips 120 of the first chip group 12 and the blue LED chips of the second chip group 13 are electrically connected in series by metal wires 16. A total light output of the first or second chip group 12 (13) depends on the total light-emitting area of the red or blue LED chips 120 (130).

When each of the blue LED chips 130 has a light-emitting area equal to that of each red LED chip 120, an amount of the plurality of blue LED chips 130 is larger than that of the red LED chips 120. As such, the plurality of blue LED chips 130 has a total light-emitting area larger than that of the plurality of red LED chips 120. Therefore, the second chip group 13 has a total light output larger than that of the first chip group 12, thereby to produce the white light. In this embodiment, a ratio of the amount of the plurality of blue LED chips 130 and the amount of the plurality of red LED chips 120 ranges from 2:1 to 4:1, when the light emitting area of each blue LED chip 130 is equal that of each red LED chip 120. Preferably, the ratio ranges from 7:3 to 7:2. More preferably the ratio is exactly 7:3 or exactly 7:2.

When the blue LED chip 130 has a light-emitting area unequal to that of the red LED chip 120, the total amounts of the blue and red LED chips 130, 120 can be correspondingly adjusted to make the blue LED chips 130 have a total light-emitting area larger than that of the red LED chips 120, thereby ensuring that the second chip group 13 has a total light output larger than the first chip group 12 so that the required white light can still be obtained.

It is to be noted that the red LED chips 120 of the first chip group 12 and the blue LED chips 130 of the second chip group 13 can also be electrically connected in parallel or in hybrid to generate the white light, only if the second chip group 13 has a total light output larger than that of the first chip group 12.

Figure 2:
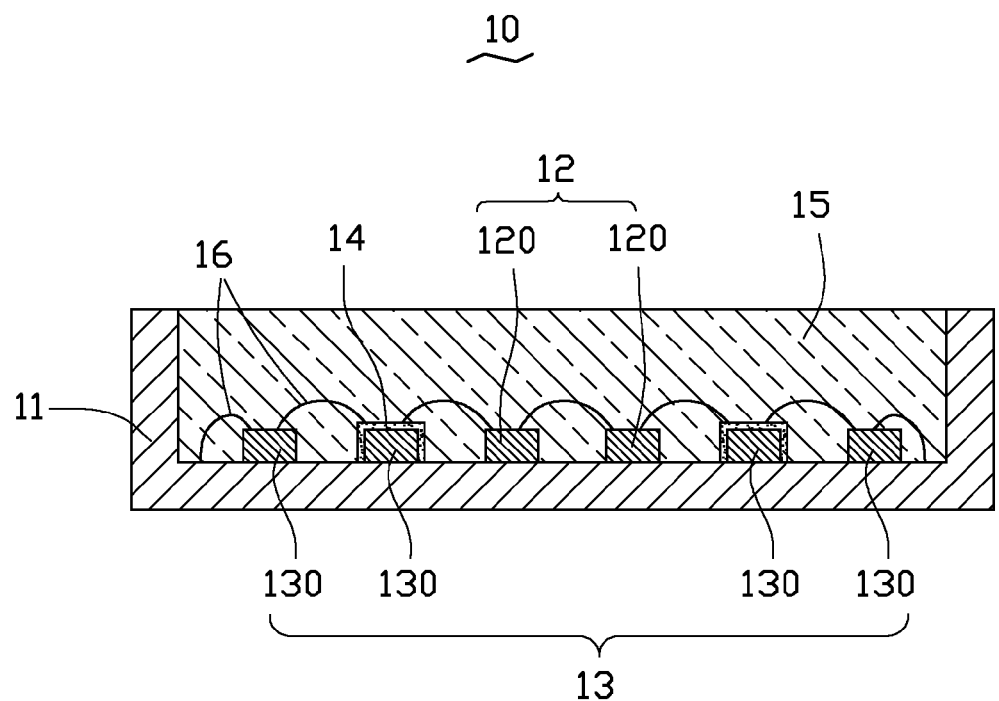
FIG. 2 is a cross-sectional view of an LED package in accordance with an alternative embodiment of the present disclosure.

Further, the optical wavelength converting substance 14 is not limited to be mixed in an interior of the encapsulation 15. The optical wavelength converting substance 14 can also be directly formed on light-emitting surfaces of some of the blue LED chips 130, as shown in FIG. 2. The optical wavelength converting substance 14 is not limited to include the fluorescent material emitting green light when excited by blue light. The optical wavelength converting substance 14 can also includes other type of fluorescent materials emitting light with wavelengths range from 500 nanometers to 700 nanometers, for example blue-green light, yellow-green light, yellow light, orange light and so on.

Due to that the white light of the LED package 10 is made by mixing three differently-colored light (red, green and blue light), the LED package 10 has a wide color gamut and thereby achieving an excellent color rendition. Furthermore, because the LED package 10 only includes LED chips of two different colors (i.e., the red LED chips 120 and blue LED chips 130), a process of making the LED package 10 is simplified to a certain extent, thereby reducing the manufacturing cost.

For using the LED package 10 directly without requiring any additional voltage converting (usually, lowering) circuits, in one embodiment, the plurality of red LED dies of the red LED chips 120 and the plurality of blue LED dies of the blue LED chips 130 are electrically connected in parallel to an external, direct/alternative-current power source which has a voltage of V. Furthermore, it is assumed that the blue chips 130 have a number of M1. Each blue chip 130 has blue LED dies with a number of N1. The red chips 120 have a number of M2. Each red chip 120 has red LED dies with a number of N2. Then the following two conditions should be satisfied in accordance with the present disclosure: (1): $1 \leq M1*N1 \leq V/2$ and (2): $1 \leq M2*N2 \leq V/2$. As such, an average voltage applied to each of the blue and red LED dies has a range of 2~4 volts, which is a normal working voltage range of the blue and red LED dies. For example, when V is equal to 110 volts, the product of M1 and N1 should be smaller than 55 and the product of M2 and N2 should also be smaller than 55.

For using the LED package 10 directly without requiring any additional voltage converting (usually, lowering) circuits, in another embodiment, the plurality of red LED dies of the red LED chips 120 and the plurality of blue LED dies of the blue LED chips 130 are electrically connected in series to an external, direct/alternative-current power source which has a voltage of V. Furthermore, it is assumed that the blue chips 130 have a number of M1. Each blue chip 130 has blue LED dies with a number of N1. The red chips 120 have a number of M2. Each red chip 120 has red LED dies with a number of N2. Then the following condition should be satisfied in accordance with the present disclosure: $(M1*N1+M2*N2) \leq V \leq 4*(M1*N1+M2*N2)$. Alternatively, the total amount of the blue and red LED dies, i.e. $M1*N1+M2*N2$ should satisfy the following condition: $V/4 \leq M1*N1+M2*N2 \leq V/2$. As such, an average voltage applied to each of the blue and red LED dies has a range of 2~4 volts, which is a normal working voltage range of the blue and red LED dies.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A light-emitting diode (LED) package comprising:
a first chip group comprising a plurality of red LED chips configured for emitting red light;
a second chip group comprising a plurality of blue LED chips configured for emitting blue light; and
an optical wavelength converting substance arranged on light paths of the blue LED chips, wherein the optical wavelength converting substance is configured for partly absorbing blue light emitted from the blue LED chips and emitting visible lights with different wavelengths, and the plurality of blue LED chips have a total light output larger than that of the plurality of red LED chips.

2. The LED package according to claim 1, wherein a ratio of an amount of the plurality of blue LED chips and an amount of the plurality of red LED chips ranges from 2:1 to 4:1.

3. The LED package according to claim 2, wherein the ratio ranges from 7:3 to 7:2.

4. The LED package according to claim 3, wherein the ration is one of an exact 7:3 and an exact 7:2.

5. The LED package according to claim 1, wherein the optical wavelength converting substance emits visible lights with a wavelength range from 500 nanometers to 700 nanometers.

6. The LED package according to claim 1, wherein the optical wavelength converting substance emits green light, yellow-green light, yellow light or orange light.

7. The LED package according to claim 1, wherein each red LED chip comprises a plurality of red LED dies electrically connected together in series, in parallel or in hybrid.

8. The LED package according to claim 7, wherein the plurality of red LED dies is electrically connected together in series, in parallel or in hybrid.

9. The LED package according to claim 8, wherein each blue LED chip comprises a plurality of blue LED dies electrically connected together in series, in parallel or in hybrid.

10. The LED package according to claim 9, wherein the plurality of blue LED dies is electrically connected together in series, in parallel or in hybrid.

11. The LED package according to claim 10, wherein the plurality of red LED chips of the first chip group and the plurality of blue LED chips of the second chip group are electrically connected in parallel, an amount of the blue LED chips being M1, an amount of the red LED chips being M2, an amount of the blue LED dies in each blue LED chip being N1, and an amount of the red LED dies in each red LED chip being N2, a voltage applied to the LED package being V, the M1, M2, N1, N2 and V satisfying following two conditions: (1): $1 \leq M1*N1 \leq V/2$ and (2): $1 \leq M2*N2 \leq V/2$.

12. The LED package according to claim 10, wherein the plurality of red LED chips of the first chip group and the plurality of blue LED chips of the second chip group are electrically connected in series, an amount of the blue LED chips being M1, an amount of the red LED chips being M2, an amount of the blue LED dies in each blue LED chip being N1, and an amount of the red LED dies in each red LED chip being N2, a voltage applied to the LED package being V, the M1, M2, N1, N2 and V satisfying following condition: $V/4 \leq M1*N1+M2*N2 \leq V/2$.

* * * * *